(12) United States Patent
Wang

(10) Patent No.: US 8,223,899 B2
(45) Date of Patent: Jul. 17, 2012

(54) METHODS AND APPARATUS FOR INITIAL ACQUISITION GAIN CONTROL IN A COMMUNICATION SYSTEM

(75) Inventor: Michael Mao Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 328 days.

(21) Appl. No.: 11/690,590

(22) Filed: Mar. 23, 2007

(65) Prior Publication Data

US 2008/0304603 A1    Dec. 11, 2008

(51) Int. Cl.
*H04L 27/08* (2006.01)

(52) U.S. Cl. ........ 375/345; 375/260; 375/324; 375/329; 375/340; 375/344

(58) Field of Classification Search .................. 375/340, 375/345, 260, 324, 329, 344; 455/232.1, 455/234.1
See application file for complete search history.

(56) References Cited

U.S. PATENT DOCUMENTS

| | | | | |
|---|---|---|---|---|
| 6,834,185 | B2 * | 12/2004 | Fujii | ........................... 455/232.1 |
| 2005/0002478 | A1 | 1/2005 | Agami et al. | |
| 2005/0276359 | A1 * | 12/2005 | Xiong | ........................... 375/345 |
| 2006/0079193 | A1 | 4/2006 | Sato et al. | |

FOREIGN PATENT DOCUMENTS

| | | |
|---|---|---|
| CN | 1363137 A | 8/2002 |
| CN | 1638368 A | 7/2005 |
| EP | 1172930 A1 | 1/2002 |
| EP | 1650890 A1 | 4/2006 |
| JP | 2001308733 A | 11/2001 |
| KR | 20050114232 A | 12/2005 |
| KR | 100668663 | 1/2007 |
| RU | 2163416 | 2/2001 |
| TW | I268050 | 12/2006 |
| TW | I269558 | 12/2006 |
| TW | I269567 | 12/2006 |
| WO | WO9530274 | 11/1995 |
| WO | WO2005011165 A1 | 2/2005 |
| WO | WO2007037656 | 4/2007 |

OTHER PUBLICATIONS

International Search Report and Written Opinion—PCT/US2008/057712—ISAEPO—Jul. 23, 2008.
Taiwan Search Report—TW097110300—TIPO—Sep. 13, 2011.

* cited by examiner

*Primary Examiner* — Leon Flores
(74) *Attorney, Agent, or Firm* — Stanton Braden

(57) ABSTRACT

Methods and apparatus for initial acquisition gain control in a communication system a method for use in a wireless communication system are disclosed. A disclosed methodology includes measuring the power of a signal received by a transceiver a number of times over a prescribed time period, the signal including a number of symbols. A gain of the transceiver is unidirectionally adjusted when a currently measured power is greater than a previously measured power during the prescribed time period until a maximal power level is measured. By adjusting the gain to accommodate a maximal power value, which is the same as the power level of an acquisition pilot symbol, overshoot and distortion by the transceiver are avoided during initial timing and frequency acquisition. Corresponding apparatus are also disclosed.

32 Claims, 5 Drawing Sheets

METHODS AND APPARATUS FOR INITIAL ACQUISITION GAIN CONTROL IN A COMMUNICATION SYSTEM

BACKGROUND

1. Field

The present disclosure relates generally to methods and apparatus for initial acquisition gain control in a communication system and, more particularly, to methods and apparatus for adjusting the gain of a transceiver when receiving initial acquisition symbols in a wireless communication system to prevent overshoot due to incorrect gain settings.

2. Background

In particular communication systems such as orthogonal frequency division multiplexing (OFDM) communication systems, it is known to transmit one or more specific OFDM symbols for use in assisting a receiver portion of a transceiver in initial timing and frequency acquisition. The one or more specific OFDM symbols, which are acquisition pilot symbols, are repeatedly transmitted at a full or maximal power value at a fixed time interval. The receiver portion of a transceiver uses the symbols to obtain initial timing and frequency acquisition, such as when the transceiver is powered up or wakes up from a sleep mode.

In typical transceivers, however, gain control such as automatic gain control (AGC), is used to set a gain of the receiver portion based on the measured power of the received symbol. In certain situations an OFDM symbol may precede the acquisition pilot symbol or symbols and may not be transmitted at full power, such as in the case where the preceding OFDM symbol is only partially loaded with data. In such a case, the gain setting of the gain control may be set in a range too high to properly resolve the next OFDM acquisition pilot symbol transmitted at full power, thus leading to overshoot or distortion of the signal amplification. This leads to initial acquisition failure, degrading the performance of the receiver portion of the transceiver.

SUMMARY

According to an aspect of the present disclosure, a method for use in a wireless communication system is disclosed. The method includes measuring a power of a signal received by a transceiver a plurality of times over a prescribed time period at predetermined time increments, the signal including a plurality of symbols. Further, the method includes unidirectionally adjusting a gain of the transceiver when a currently measured power is higher than a previously measured power based on a maximal power value of the signal measured during the prescribed time period According to another aspect of the present disclosure, an apparatus operable in a wireless communication system is disclosed. The apparatus includes a processor configured to measure a power of a signal received by a transceiver a plurality of times over a prescribed time period, the signal including a plurality of symbols. The processor is also configured to unidirectionally adjust a gain of the transceiver when a currently measured power is higher than a previously measured power; and a memory coupled to the processor.

According to yet another aspect of the present disclosure, another apparatus operable in wireless communication system is disclosed. The apparatus includes means for measuring a power of a signal received by a transceiver a plurality of times over a prescribed time period, the signal including a plurality of symbols; and means for unidirectionally adjusting a gain of the transceiver when a currently measured power is higher than a previously measured power.

According to still another aspect of the present disclosure, a computer program product is disclosed. The computer program product includes a computer-readable medium having code for causing at least one computer to measure a power of a signal received by a transceiver a plurality of times over a prescribed time period, the signal including a plurality of symbols. The computer-readable medium also includes code for causing the at least one computer to unidirectionally adjust a gain of the transceiver when a currently measured power is higher than a previously measured power.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

The present disclosure includes methods and apparatus that ensure a gain setting in a receiver portion of a transceiver to be set sufficiently low to prevent overshoot or distortion during initial timing and frequency acquisition. The methods and apparatus set the receiver gain by measuring power values of received symbols in a signal occurring over a time period equal to the periodicity of initial acquisition pilot symbols. The gain is unidirectionally adjusted (i.e., reduced) to account for the highest power symbol received, thus ensuring that the gain is set appropriately low enough for the full or maximal power of the initial acquisition pilot symbol without overshoot or distortion by the amplifier.

Figure 1:
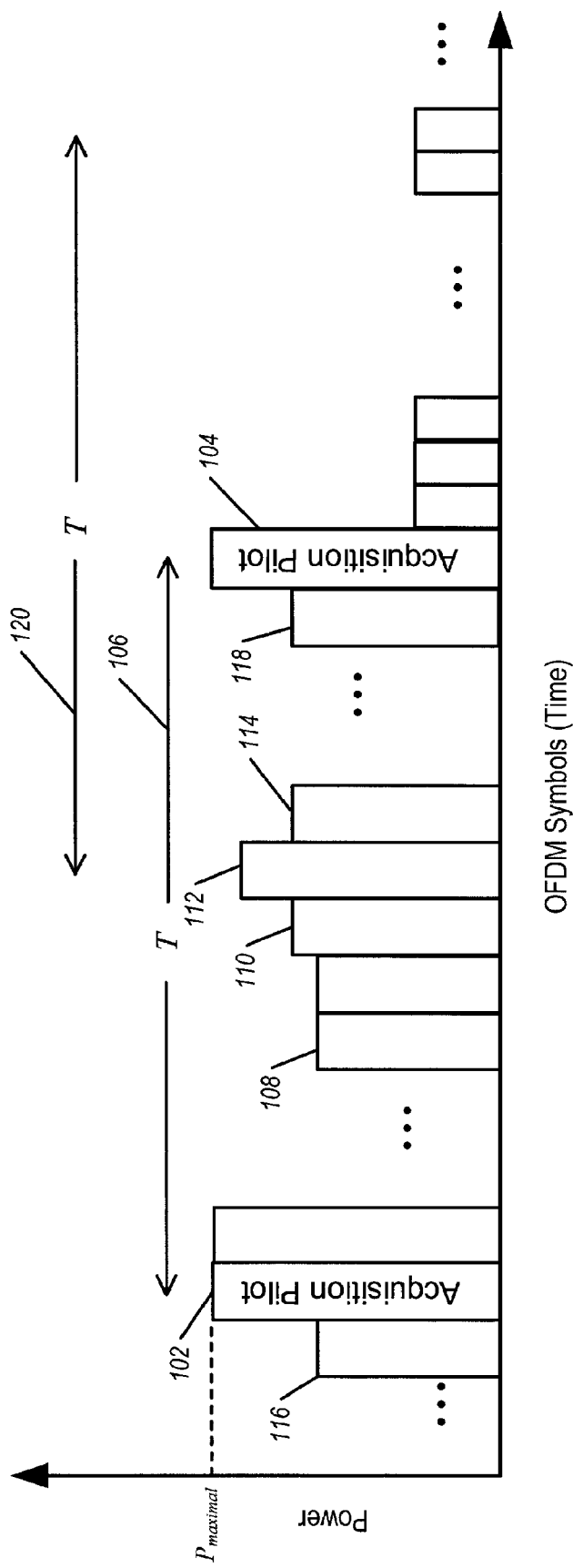
FIG. 1 is an exemplary graph of the power levels of multiple received OFDM symbols over time in a communication system.

FIG. 1 illustrates an exemplary graph of the power levels of multiple received OFDM symbols over time in a communication system. As may be seen in FIG. 1, the power levels of the particular symbols in an OFDM signal typically vary from symbol to symbol. Acquisition pilot symbols, which are typically transmitted in the preamble of a superframe, are transmitted at a known power level and periodicity of T. The example of FIG. 1 illustrates two neighboring acquisition symbols 102 and 104, and that they occur each time period T (see arrow 106). Acquisition symbols, such as 102 and 104, are always transmitted at a predetermined power value, which is the maximal power value ($P_{maximal}$) in this example.

As was explained briefly above, symbols intervening between the acquisition pilots 102 and 104, such as 108, 110, 112, and 114, are not transmitted at full or maximal power. In conventional transceivers, the automatic gain control (AGC) will adjust the gain for each symbol based on its measured power level. Accordingly in the case of a lower power symbol preceding the full power acquisition symbol, such as symbols 116 and 118 occurring just prior to acquisition pilots 102 and 104, respectively, the gain setting for symbols 116 and 118 will be quite high in comparison to the gain setting needed for full power symbols 102 and 104. Accordingly, transceivers cannot always respond quickly enough, particularly during initial timing and frequency acquisition after a transceiver wakes up or is turned on, to adjust the gain downward in order to avoid overshoot or distortion. Such overshoot and distortion may cause the transceiver to incorrectly estimate the symbol, resulting in unsuccessful timing and frequency acquisition. The greater difference in power levels between the preceding symbol and the acquisition symbol increases the error likelihood.

Figure 2:
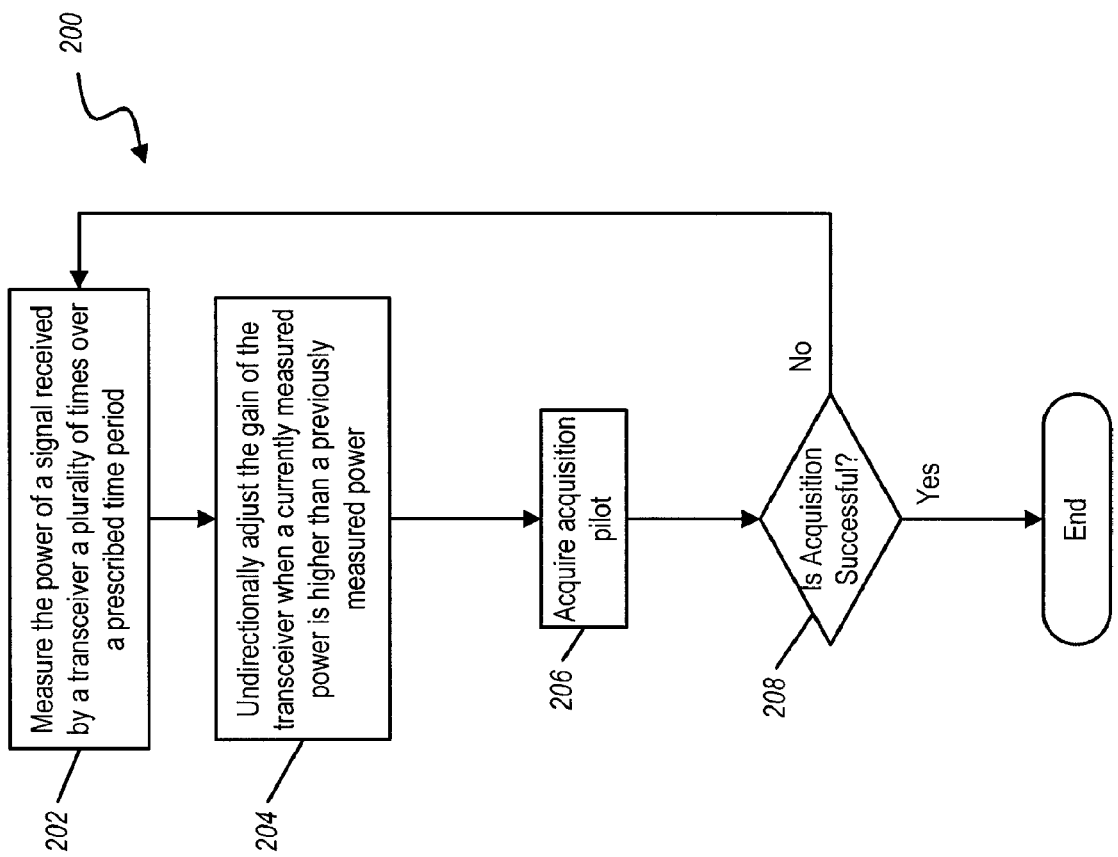
FIG. 2 is a flow diagram of a process for adjusting gain in a transceiver during initial timing and frequency acquisition.

FIG. 2 illustrates a flow diagram of a process for adjusting gain in a transceiver during initial timing and frequency acquisition. The process 200 begins by measuring the power of a signal received by a transceiver a plurality of times over a prescribed time period as shown in block 202. In the procedure of block 202, the prescribed time period may be the period T between acquisition pilot symbols. It is noted that setting the measurement time period to T ensures that at least one acquisition pilot symbol will be received and measured. Additionally, the plurality of times or instances that the power of the signal is measured may be at intervals set at a time length to ensure that each symbol of the signal is represented in the power measurement. Referring back to FIG. 1, as an example, it may be seen that if the prescribed time period equal to the acquisition pilot periodicity T starts and ends at some time between acquisition pilots as illustrated by time period 120, at least one acquisition pilot (e.g., 104) is ensured to be measured.

Flow proceeds from block 202 to block 204 where the gain of the transceiver is unidirectionally adjusted when a currently measured power is higher than a previously measured power. It is further noted that the gain is adjusted unidirectionally downward to a minimal value to account for a full or maximal power symbol (i.e., the acquisition symbol) without overshoot and distortion of the amplifier. It is noted that, unlike typical gain control such as AGC, the process 200 adjusts gain in one direction (i.e., unidirectional). Thus, for example, if a first symbol measured results in a downward gain adjustment, the unidirectional adjustment of process 200 ensures that the gain is not later increased if a subsequently measured symbol has a lower power than the first symbol, which would be the case in conventional AGC.

Although the process 200 illustrates the process of setting the gain as occurring after measurement of the plurality of symbols, it is to be understood that the gain of the receiver (e.g., the AGC gain) may be set after each symbol is measured. Thus, the processes in blocks 202 and 204 would repeatedly be performed during the prescribed time period, prior to the transceiver acquiring the acquisition pilot symbol for initial timing and frequency acquisition. Another example illustrating this process will be more fully explained later in connection with FIG. 3.

After the gain has been appropriately set at block 204, flow proceeds to block 206 where the transceiver attempts to acquire the acquisition pilot 206. After the transceiver attempts to acquire the acquisition pilot, a determination may be made whether acquisition was successful as indicated by decision block 208. If acquisition is successful, timing and frequency have been acquired and the process 200 ends. If acquisition is not successful, flow proceeds back to block 202 where the procedure may be repeated for one or more subsequent prescribed time periods until timing and frequency acquisition is successfully performed. Once the process 200 ends with successful acquisition, gain control of the AGC is returned to normal operation for receiving and processing received symbols.

While, for purposes of simplicity of explanation, the process 200 shown and described as a series or number of acts, it is to be understood that these described acts are not limited by their order, and may occur in different orders or concurrently with other acts described. For example, those skilled in the art will appreciate that a methodology could alternatively be represented as a series of interrelated states or events, such as in a state diagram. Moreover, not all illustrated acts may be required to implement a methodology in accordance with the presently disclosed methodologies. It is further noted that the processes illustrated in FIG. 2 may be implemented by one or more processors, an automatic gain control (AGC) module, or a combination thereof.

Figure 3:
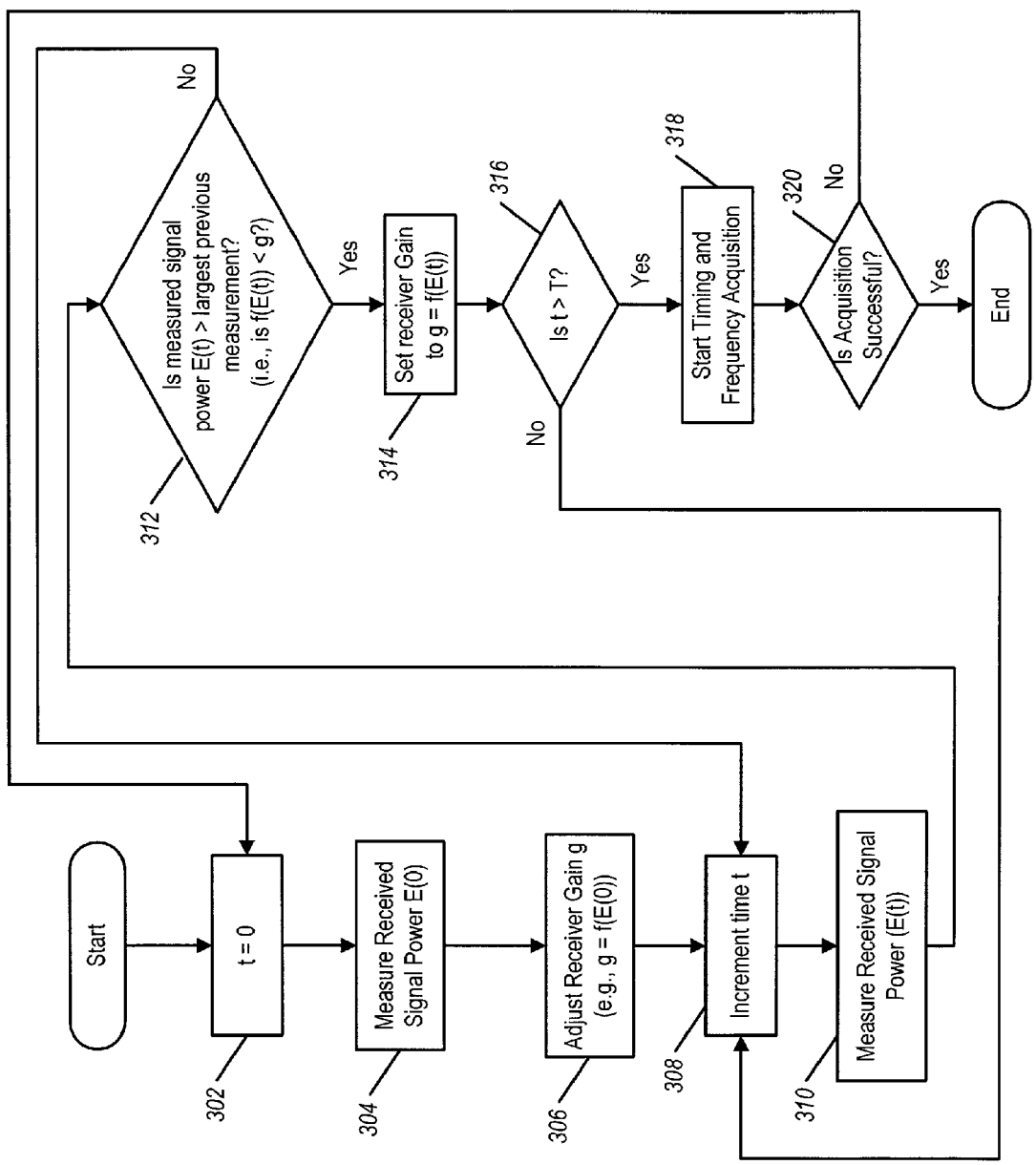
FIG. 3 illustrates a flow diagram of another exemplary method for gain control during initial acquisition.

FIG. 3 illustrates a flow diagram of another exemplary method for gain control during initial acquisition. As shown, a method 300 begins with setting a time t equal to zero (0) as illustrated in block 302. After initialization of time t, flow proceeds to block 304 where a signal power at time zero (E(0)) is measured. After measurement of the signal power, flow proceeds to block 306 where the gain g of the receiver portion of a transceiver is adjusted as function of the measured power (e.g., g=f(E(0)).

After the receiver gain is set in block 306, flow proceeds to block 308, where the time count is incremented by a predetermined time interval. As an example of the interval length could be ¼ of a symbol time interval to ensure that each symbol received in the signal is measured. After incrementing of the time t, flow proceeds to block 310 where the received signal power is measured at the incremented time (E(t)). After the power measurement in block 310, flow proceeds to decision block 312 where a determination is made whether the current measured signal power (E(t)) is greater than the largest previous measurement. Stated another way, determination may be made whether the gain function of the current measured signal power f(E(t)) is less than the current gain setting g. If the gain as a function of the current measured power is less than the currently set gain g, this signifies that the power level E(t) is greater and that the corresponding gain setting is reduced to accommodate the higher power level. Accordingly, if the measured signal power is not greater than the largest previous measurement, flow proceeds back to block 308 to increment to the next time t and measure the signal power at that time.

On the other hand, if the measured signal power at block 312 is greater than the largest previous measurement, flow proceeds to block 314 where the receiver gain g is set equal to the gain function of the current measured power (i.e., f(E(t)). After block 314, flow proceeds to block 316 where a determination is made whether the current incremented time t is greater than the prescribed time period T, which is the time periodicity of the acquisition pilot symbols within the signal. If the time period T has not yet transpired, flow reverts back to block 308 for the next incrementing of time t.

If the time period T has passed as determined at block 316, flow proceeds to block 318 where the receiver initiates timing and frequency acquisition. It is noted that the gain setting g is now set to accommodate the largest or maximal power level of the received signal, thereby ameliorating the likelihood that errors will not occur due to a gain setting based on lower power symbols. After initiating of timing and frequency acquisition, flow proceeds to decision block 320 to determine if the timing and frequency acquisition was successful. If not, flow proceed back to block 302, where the process of power measurements and gain setting is repeated until successful acquisition. If acquisition is successful, the process 300 ends and operation of the transceiver and the gain control returns to normal operation for receiving and processing signals.

Figure 4:
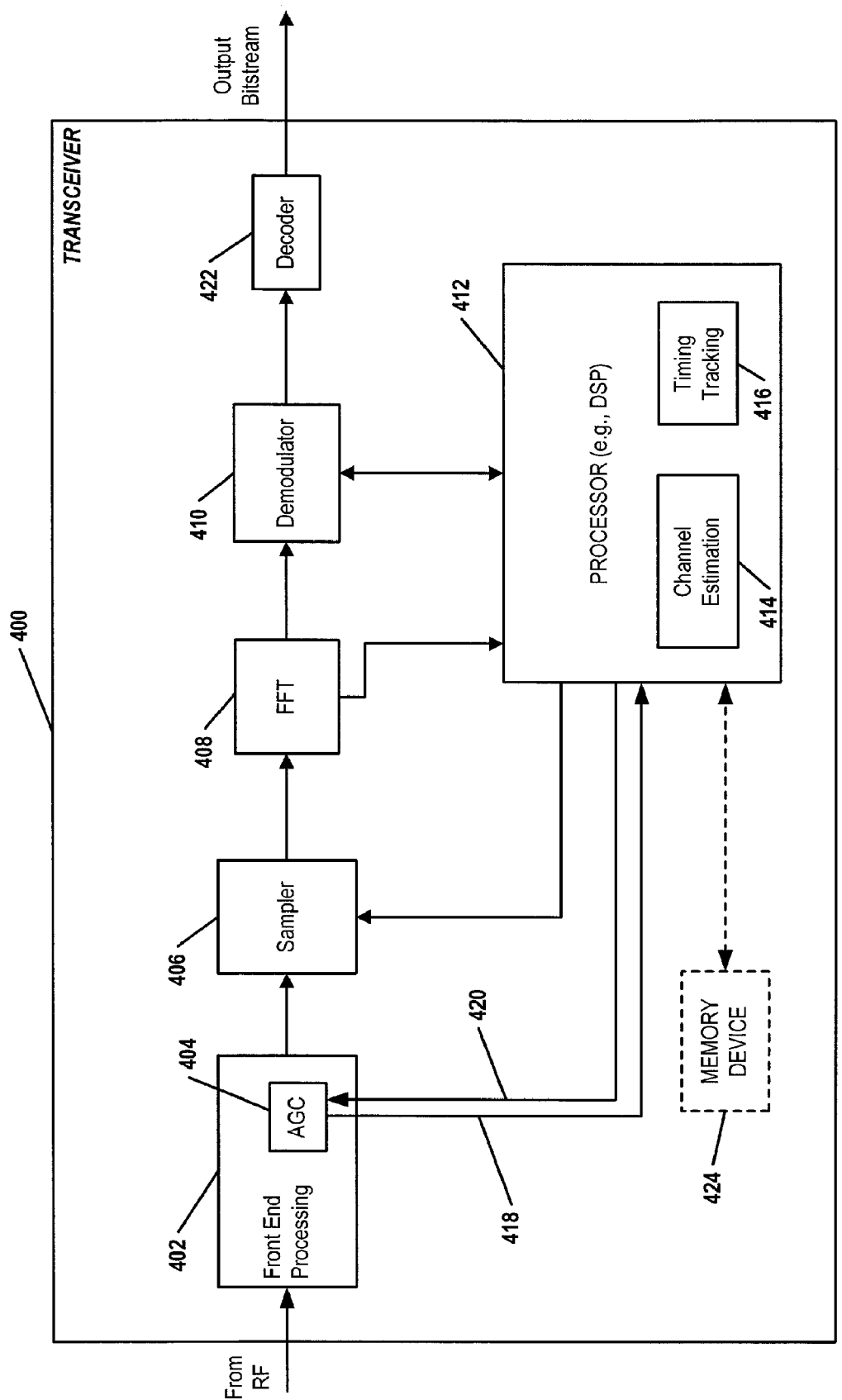
FIG. 4 illustrates an exemplary transceiver apparatus that may implement the methods illustrated in FIGS. 1 and 2.

FIG. 4 illustrates an example of a transceiver apparatus that may implement the methods illustrated in FIGS. 2 and 3. The apparatus 400 includes a front end processing module 402 that receives an input RF signal, such as an OFDM signal. The front end processing includes A/D conversion, as well as Automatic gain control (AGC) as illustrated by module 404. Signals are then passed to a sampler 406, which set a sampling window for resolving symbols passed, in turn, to a Fast Fourier Transform (FFT) 408. The FFT 408 performs a fast Fourier transform of the signal to convert from frequency to time domain, for example. The converted signal is sent to demodulator 410 to demodulate the signal according to any number of known modulation schemes.

The output of the FFT 408 is also delivered to a processor 412, such as digital signal processor (DSP), as an example, or any other suitable processor. The processor may include performance of channel estimation 414 and time tracking 416. Although the channel estimation and time tracking are shown as module in the processor 412, these modules may also be implemented by separate hardware, software, or firmware.

In connection with implementing the methodologies discussed above with respect to FIGS. 2 and 3, the processor may be in communication with the AGC 404 in order to implement gain control. In particular, the AGC 404 may be configured to measure the power of the incoming signal and communicate these power measurements to the processor, as illustrated by communication connection 418. In turn the processor 412 may be configured to determine if the measured power of the signal is less than a current largest measurement, and either compute the gain or signal the AGC 404 to compute a gain based on the measured signal power having a value larger than the previously largest measured power. This communication is illustrated by communication line 420 in FIG. 4.

After the prescribed time period T, discussed previously, the processor 412 in conjunction with FFT 408, channel estimation 414 and timing tracking 316, may then acquire the acquisition pilot channel in order to determine initial timing and frequency. After initial acquisition, processor 412 may signal to AGG 404 to resume normal gain control operation.

FIG. 4 also shows that processor 412 communicates with sampler 406 to set the timing window for FFT 408, and also communicates with demodulator 410 to demodulate data in the received symbols and then pass the decoded symbols to decoder 422 for decoding according to any number of suitable encoding schemes. Decoder 422 outputs a bit stream to other processing elements of the transceiver for further processing. It is noted that a memory device 424, which may consist of any number of known storage devices, is included to store instructions causing the processor 412 to effect the methodologies and operations disclosed herein.

Figure 5:
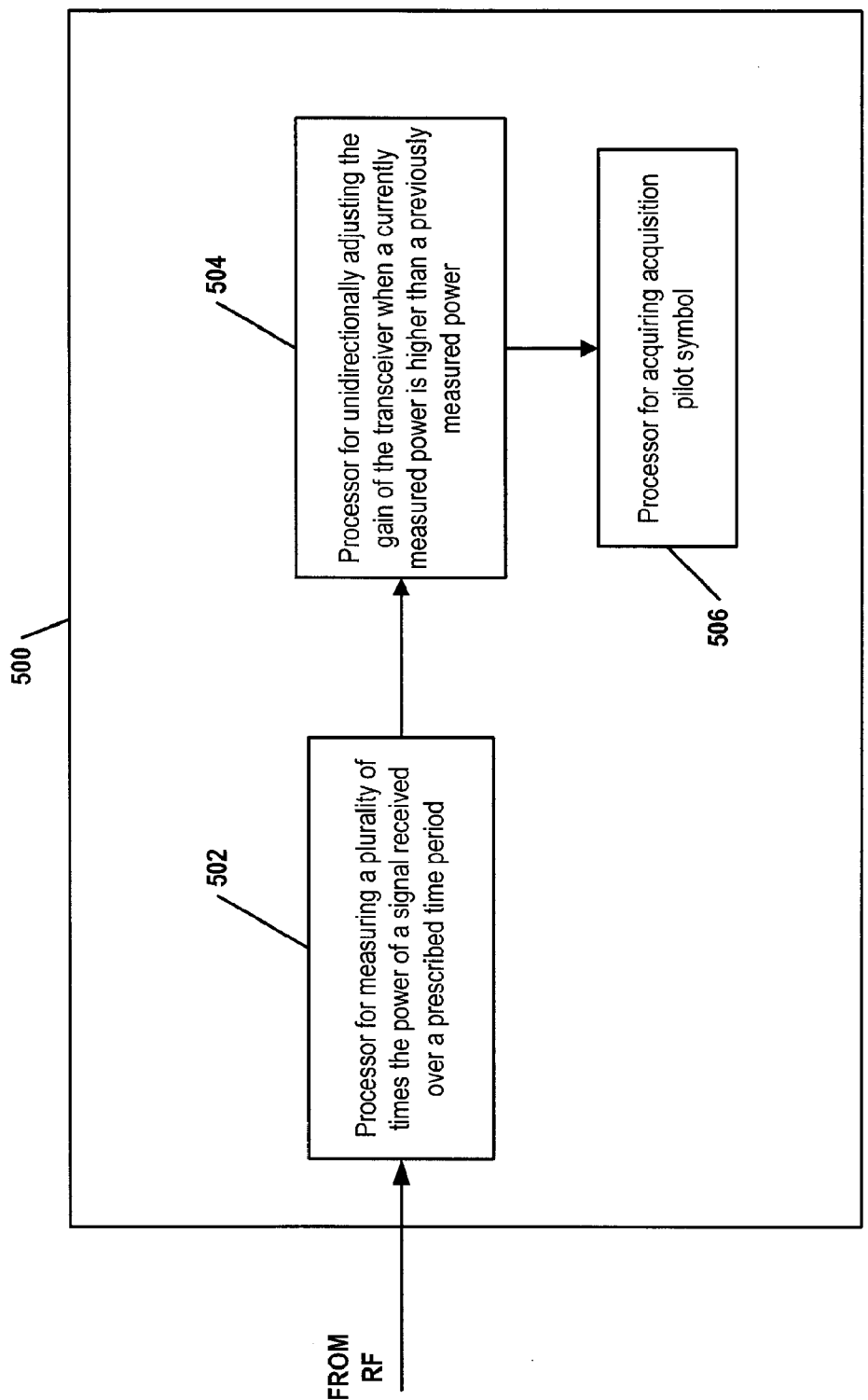
FIG. 5 is a diagram of an apparatus that may be used in a transceiver for setting gain during initial timing and frequency acquisition.

FIG. 5 illustrates another example of an apparatus that may be used in a transceiver for setting gain during initial timing and frequency acquisition. As illustrated, the apparatus 500 includes a processor 502 for measuring a plurality of times the power of a signal (e.g., RF signal) received over a prescribed time period (e.g., T). It is noted that processor 500 may be implemented by AGC 404 and processor 412, as an example. The power measurements determined by processor 502 are output to processor 504 for unidirectionally adjusting the gain of the transceiver when a currently measured power is higher than a previously measured power. Processor 504 may be implemented by AGC 404, processor 412, or a combination thereof, as examples. It is noted here that although implementation of processor 504 by an AGC may be embodied, the operation of the AGC would be altered from normal operation to effect unidirectional adjustment during the initial acquisition period.

Apparatus 500 further includes processor 506 for acquiring an acquisition pilot symbol after the gain has been set or adjusted by processor 504. It is noted that processor 506 may implemented through the used of sampler 406, FFT 408, and processor 412, as examples.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium (e.g., memory 424 in FIG. 4) is coupled to the processor (e.g., processor 412 in FIG. 4) such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The examples described above are merely exemplary and those skilled in the art may now make numerous uses of, and departures from, the above-described examples without departing from the inventive concepts disclosed herein. Various modifications to these examples may be readily apparent to those skilled in the art, and the generic principles defined herein may be applied to other examples, e.g., in an instant messaging service or any general wireless data communication applications, without departing from the spirit or scope of the novel aspects described herein. Thus, the scope of the disclosure is not intended to be limited to the examples shown herein but is to be accorded the widest scope consistent with the principles and novel features disclosed herein. The word "exemplary" is used exclusively herein to mean "serving as an example, instance, or illustration." Any example described herein as "exemplary" is not necessarily to be construed as preferred or advantageous over other examples. Accordingly, the novel aspects described herein are to be defined solely by the scope of the following claims.

The invention claimed is:

1. A method for use in a wireless communication system, the method comprising: receiving a signal with a transceiver; measuring a power of the signal at a plurality of discrete measurement times within a prescribed time period to produce a plurality of respectively temporally corresponding discrete measured power values, the signal including a plurality of symbols; and unidirectionally adjusting a gain of the transceiver in response to a determination that one said discrete measured power value is higher than another earlier said discrete measured power value; wherein adjusting the gain of the transceiver further comprises: further measuring a power of the signal and reducing the gain until a maximal power value is measured.

2. The method as defined in claim 1, further comprising: acquiring an initial acquisition symbol after the prescribed time period is over and the gain has been adjusted.

3. The method as defined in claim 2, wherein the initial acquisition symbol has a power value that is equal to a maximal said discrete measured power value.

4. The method as defined in claim 1, further comprising: initiating timing and frequency acquisition of the transceiver after the prescribed time period is over.

5. The method as defined in claim 4, wherein adjusting the gain of the transceiver is repeated during one or more subsequent prescribed time periods when the timing and frequency acquisition of the transceiver is not successful.

6. The method as defined in claim 1, wherein the prescribed time period is equal to a fixed periodic time period between two neighboring initial acquisition symbols in the signal.

7. The method as defined in claim 1, wherein the method is performed at least prior to or during an initial transceiver timing and frequency acquisition period.

8. The method as defined in claim 1, wherein the plurality of symbols comprise orthogonal frequency division multiplexed symbols.

9. An apparatus operable in a wireless communication system comprising: a processor configured to: measure a power of a signal at a plurality of discrete measurement times within a prescribed time period to produce a plurality of respectively temporally corresponding discrete measured power values, the signal received by a transceiver and including a plurality of symbols, and unidirectionally adjust a gain of the transceiver in response to a determination that one said discrete measured power value is higher than another earlier said discrete measured power value; and a memory coupled to the processor; wherein the processor is further configured to further measure a power of the signal and reduce the gain until a maximal power value is measured.

10. The apparatus as defined in claim 9, wherein the processor is further configured to acquire an initial acquisition symbol after the prescribed time period is over and the gain has been adjusted.

11. The apparatus as defined in claim 10, wherein the initial acquisition symbol has a power value that is equal to a maximal said discrete measured power value.

12. The apparatus as defined in claim 9, wherein the processor is further configured to initiate timing and frequency acquisition of the transceiver after the prescribed time period is over.

13. The apparatus as defined in claim 12, wherein adjusting the gain of the transceiver is repeated during one or more subsequent prescribed time periods when the timing and frequency acquisition of the transceiver is not successful.

14. The apparatus as defined in claim 9, wherein the prescribed time period is equal to a fixed periodic time period between two neighboring initial acquisition symbols in the signal.

15. The apparatus as defined in claim 9, wherein the processor is configured to determine the gain adjustment amount prior to or during initiation of an initial transceiver timing and frequency acquisition period.

16. The apparatus as defined in claim 9, wherein the plurality of symbols comprise orthogonal frequency division multiplexed symbols.

17. An apparatus operable in a wireless communication system, the apparatus comprising: first means for measuring a power of a signal at a plurality of discrete measurement times within a prescribed time period to produce a plurality of respectively temporally corresponding discrete measured power values, the signal received by a transceiver and including a plurality of symbols; and second means for unidirectionally adjusting a gain of the transceiver in response to a determination that one said discrete measured power value is higher than another earlier said discrete measured power value; wherein the second means comprises: means for further measuring a power of the signal and reducing the gain until a maximal power value is measured.

18. The apparatus as defined in claim 17, further comprising:
means for acquiring an initial acquisition symbol after the prescribed time period is over and the gain has been adjusted.

19. The apparatus as defined in claim 18, wherein the initial acquisition symbol has a power value that is equal to a maximal said discrete measured power value.

20. The apparatus as defined in claim 17, further comprising:
means for initiating timing and frequency acquisition of the transceiver after the prescribed time period is over.

21. The apparatus as defined in claim 20, wherein adjusting the gain of the transceiver is repeated during one or more subsequent prescribed time periods when the timing and frequency acquisition of the transceiver is not successful.

22. The apparatus as defined in claim 17, wherein the prescribed time period is equal to a fixed periodic time period between two neighboring initial acquisition symbols in the signal.

23. The apparatus as defined in claim 17, wherein the first and second means are configured to operate at least prior to or during an initial transceiver timing and frequency acquisition period.

24. The apparatus as defined in claim 17, wherein the plurality of symbols comprise orthogonal frequency division multiplexed symbols.

25. A computer program product, comprising: a non-transitory computer-readable medium comprising: code for causing at least one computer to measure a power of a signal at a plurality of discrete measurement times within a prescribed time period to produce a plurality of respectively temporally corresponding discrete measured power values, the signal received by a transceiver and including a plurality of symbols; and code for causing the at least one computer to unidirectionally adjust a gain of the transceiver in response to a determination that one said discrete measured power value is higher than another earlier said discrete measured power value; wherein the non-transitory computer-readable medium further comprises: code for causing the at least one computer to further measure a power of the signal and reduce the gain until a maximal power value is measured.

26. The computer program product as defined in claim 25, wherein the non-transitory computer-readable medium further comprises:
    code for causing the at least one computer to acquire an initial acquisition symbol after the prescribed time period is over and the gain has been adjusted.

27. The computer program product as defined in claim 26, wherein the initial acquisition symbol has a fixed power value that is equal to a maximal said discrete measured power value.

28. The computer program product as defined in claim 25, wherein the non-transitory computer-readable medium further comprises:
    code for causing the at least one computer to initiate timing and frequency acquisition of the transceiver after the prescribed time period is over.

29. The computer program product as defined in claim 25, wherein the non-transitory computer-readable medium further comprises:
    code for causing the at least one computer to repeatedly adjust the gain of the transceiver during one or more subsequent prescribed time periods when the timing and frequency acquisition of the transceiver is not successful.

30. The computer program product as defined in claim 25, wherein the prescribed time period is equal to a fixed periodic time period between two neighboring initial acquisition symbols in the signal.

31. The computer program product as defined in claim 25, wherein the non-transitory computer-readable medium further comprises:
    code for causing the at least one computer to adjust the gain at least prior to or during an initial transceiver timing and frequency acquisition period.

32. The computer program product as defined in claim 25, wherein the plurality of symbols comprise orthogonal frequency division multiplexed symbols.

* * * * *